United States Patent
Tsai (10) Patent No.: US 9,433,966 B2
(45) Date of Patent: Sep. 6, 2016

(54) METHOD AND SYSTEM OF CHEMICAL BATH DEPOSITION

(71) Applicant: TSMC Solar Ltd., Taichung (TW)

(72) Inventor: Pei-Chen Tsai, Shuishang Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 23 days.

(21) Appl. No.: 14/186,002

(22) Filed: Feb. 21, 2014

(65) Prior Publication Data

US 2015/0239001 A1    Aug. 27, 2015

(51) Int. Cl.
| | |
|---|---|
| B05C 3/00 | (2006.01) |
| B05C 11/00 | (2006.01) |
| B05C 13/00 | (2006.01) |
| B05C 11/10 | (2006.01) |
| B05C 3/02 | (2006.01) |
| H01L 31/18 | (2006.01) |

(52) U.S. Cl.
CPC ........... B05C 11/1002 (2013.01); B05C 3/005 (2013.01); B05C 3/02 (2013.01); H01L 31/1828 (2013.01); *Y02E 10/50* (2013.01); *Y02P 70/521* (2015.11)

(58) Field of Classification Search
USPC .......... 118/429, 612, 610, 58; 204/262, 273, 204/274, 275.1, 237; 427/345, 443.2
See application file for complete search history.

(56) References Cited

U.S. PATENT DOCUMENTS

| | | | | |
|---|---|---|---|---|
| 4,660,988 A | * | 4/1987 | Hara | B01F 5/10 366/107 |
| 5,482,068 A | * | 1/1996 | Kitahara | B08B 3/04 134/182 |
| 5,938,845 A | * | 8/1999 | Ang | C23C 18/1617 118/429 |
| 2003/0079759 A1 | * | 5/2003 | Fujioka | B08B 3/102 134/10 |
| 2004/0197485 A1 | * | 10/2004 | Wang | C23C 18/1619 427/437 |
| 2009/0003508 A1 | | 1/2009 | Hosokawa et al. | |
| 2009/0003518 A1 | * | 1/2009 | Sadakane | A61B 6/14 378/19 |

OTHER PUBLICATIONS

Official Action issued Jan. 18, 2016 in counterpart Taiwan patent application.

* cited by examiner

*Primary Examiner* — Yewebdar Tadesse
(74) *Attorney, Agent, or Firm* — Duane Morris LLP (57) ABSTRACT

An apparatus for chemical bath deposition includes a housing defining a chemical tank, a circulation pipe, and at least one flow adjustment device disposed inside the chemical tank. The chemical tank has an opening on a top surface and is configured to accept and hold at least one substrate inside the chemical tank. The circulation pipe has at least one portion inside the chemical tank, and is configured to supply at least one chemical to the chemical tank. The at least one flowing adjustment device includes any one of a turbine, a diffuser and a bubbler, or a combination thereof.

16 Claims, 6 Drawing Sheets

METHOD AND SYSTEM OF CHEMICAL BATH DEPOSITION

PRIORITY CLAIM AND CROSS-REFERENCE

None.

BACKGROUND

The disclosure relates to photovoltaic devices generally, and more particularly relates to a system and a method for making a material layer of a photovoltaic device using chemical bath deposition (CBD).

Photovoltaic devices (also referred to as solar cells) absorb sun light and convert light energy into electricity. Photovoltaic devices and manufacturing methods therefore are continually evolving to provide higher conversion efficiency with thinner designs.

Thin film solar cells are based on one or more layers of thin films of photovoltaic materials deposited on a substrate. The film thickness of the photovoltaic materials ranges from several nanometers to tens of micrometers. Examples of such photovoltaic materials include cadmium telluride (CdTe), copper indium gallium selenide (CIGS) and amorphous silicon ($\alpha$-Si). These materials function as light absorbers. A photovoltaic device can further comprise other thin films such as a buffer layer, a back contact layer, and a front contact layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an apparatus for chemical bath deposition, and a method for making a material layer such as a buffer layer of a photovoltaic device above a substrate using chemical bath deposition.

In FIGS. 1A-1C, 2A-2B, 3A-3B and 4A-4B, like items are indicated by like reference numerals, and for brevity, the description of an item with reference to one figure, is not repeated in the description of another figure containing the identical item. The methods described in FIG. 5 are described with reference to the exemplary apparatuses described in FIGS. 1A-1C, 2A-2B, 3A-3B and 4A-4B.

Unless expressly indicated otherwise, references to a "substrate" made below will be understood to encompass any suitable substrate for a semiconductor device such as a photovoltaic device. A substrate can be a single layer of a base substrate, or comprises other layers disposed above a base substrate, including but are not limited to, a back contact layer and an absorber layer.

In a thin-film photovoltaic device, a back contact layer is disposed above a suitable base substrate. An absorber layer comprising a suitable absorber material is disposed over the back contact layer. A buffer layer comprising a suitable buffer material is disposed above an absorber layer. The buffer layer and the absorber layer, which both comprises a semiconductor material, provide a p-n or n-p junction. When the absorber layer absorbs sun light, electric current can be generated at the p-n or n-p junction.

Examples of materials suitable for use in a base substrate include but are not limited to glass (e.g., soda lime glass), polymer (e.g., polyimide) film and metal foils (e.g., stainless steel). The film thickness of the base substrate is in any suitable range, for example, in the range of 0.1 mm to 5 mm in some embodiments. In some embodiments, the base substrate can comprise two or more layers, for example, a first layer comprising glass such as soda lime glass, and a second layer disposed over the first layer and comprising silicon dioxide, which can be used to block possible diffusion of sodium in glass.

Examples of suitable materials for a back contact layer include, but are not limited to molybdenum (Mo), copper, nickel, or any other metals or conductive material. The back contact layer can be selected based on the type of thin film photovoltaic device. The thickness of a back contact layer is on the order of nanometers or micrometers, for example, in the range from 100 nm to 20 microns. The back contact layer can be also etched to form a pattern.

An absorber layer can be a p-type or n-type semiconductor material. Examples of materials suitable for an absorber layer include but are not limited to copper indium gallium selenide and/or sulfide (CIGS), cadmium telluride (CdTe), and amorphous silicon (α-Si). In some embodiments, the absorber layer is a semiconductor comprising copper, indium, gallium and selenium, such as $CuIn_xGa_{(1-x)}Se_2$, where x is in the range of from 0 to 1. Selenium can be also replaced with sulfur. The absorber layer has a thickness on the order of nanometers or micrometers, for example, 0.5 microns to 10 microns, for example, in the range of 500 nm to 2 microns.

Examples of a buffer material include but are not limited to ZnS, CdS, CdSe, ZnO, ZnSe, $ZnIn_2Se_4$, $CuGaS_2$, $In_2S_3$, MgO and $Zn_{0.8}Mg_{0.2}O$ in some embodiments. Such a buffer material can be an n-type semiconductor and the absorber layer comprises p-type GIGS in some embodiments. The thickness of the buffer layer is on the order of nanometers, for example, in the range of from 5 nm to 100 nm in some embodiments.

In a thin film photovoltaic device, a front contact layer or front transparent layer can be then disposed over the buffer layer. As a part of "window layer," a front transparent layer can also comprise two layers, for example, including an intrinsic ZnO (i-ZnO) layer and a front contact layer comprising transparent conductive oxide (TCO) or any other transparent conductive coating in some embodiments. In some embodiments, undoped i-ZnO is used to prevent short circuiting in the photovoltaic device. The front contact layer is used in a photovoltaic (PV) device with dual functions: transmitting light to an absorber layer while also serving as a front contact to transport photo-generated electrical charges away to form output current. Both high electrical conductivity and high optical transmittance of the transparent conductive layer are desirable to improve photovoltaic efficiency.

Examples of a suitable material for the front contact layer include but are not limited to transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron doped ZnO (BZO), and any combination thereof. A suitable material can also be a composite material comprising at least one of the transparent conductive oxide (TCO) and another conductive material, which does not significantly decrease electrical conductivity or optical transparency of front contact layer. The thickness of front contact layer is in the order of nanometers or microns, for example in the range of 0.3 nm to 2.5 μm in some embodiments.

An anti-reflection layer can be also is formed over the front transparent layer in some embodiments. Examples of a suitable material for anti-reflection layer 116 include but are not limited to $SiO_2$ and $MgF_2$.

During the fabrication process of a photovoltaic device, a material layer can be formed using a suitable process such as chemical bath deposition. For example, in some embodiments, a buffer layer comprises CdS, ZnS or a mixture of CdS and ZnS, deposited through a chemical bath deposition (CBD) in a solution. A chemical bath deposition is sometimes called "hydrothermal reaction." In a chemical bath deposition, any reaction occurs in a solution comprising at least one chemical as a precursor for depositing a thin layer of a resulting material above a substrate at ambient or a raised temperature For example, in some embodiments, a buffer layer comprising a thin film of ZnS can be formed in an aqueous solution comprising $ZnSO_4$, ammonia and thiourea at a temperature in the temperature range of from 50° C. to 100° C. (e.g., 80° C.). A suitable solution comprises 0.16M (mole/liter) of $ZnSO_4$, 7.5M of ammonia, and 0.6 M of thiourea in some embodiments. A device comprising a base substrate, a back contact layer and an absorber layer is dipped into the solution at 80° C. for 10 to 60 minutes to form a ZnS film of suitable thickness (for example, in the range of from 5 nm to 100 nm).

For another example, a zinc-containing layer can be formed through a suitable chemical bath deposition (CBD) process. Examples of a compound for the zinc-containing layer includes but are not limited to ZnS, ZnO, Zn(OH)2, ZnSe, ZnS(O, OH), and ZnSe (O, OH), and combinations thereof. Suitable chemicals for such a CBD deposition include but are not limited to $ZnSO_4$, ammonia and thiourea. For example, ZnO can be prepared through a hydrothermal reaction or chemical bath deposition in a solution. The solution comprises a zinc-containing salt and an alkaline chemical. Any zinc containing salt can be zinc nitrate, zinc acetate, zinc chloride, zinc sulfate, combinations and hydrates thereof. One example of hydrate is zinc nitrate hexahydrate, zinc nitrate or zinc acetate. The alkaline chemical in the solution can be a strong base such as KOH or NaOH or a weak base such as ammonia or an amine.

Similarly, a Cd-containing layer can also be formed through chemical bath deposition (CBD). CdS, CdO, CdOH, CdS(O,OH), or a mixture of CdS, CdO and CdOH can be deposited through a hydrothermal reaction or chemical bath deposition (CBD) in a solution. Suitable chemicals for such a CBD deposition include but are not limited to a suitable Cd-containing salt, and an alkaline chemical such as ammonia and thiourea.

For another example, a layer of intrinsic zinc oxide (i-ZnO) can be formed above a buffer layer through chemical bath deposition in a solution, comprising a zinc-containing salt and an alkaline chemical. The zinc-containing salt can comprise zinc nitrate, zinc acetate, zinc chloride, zinc sulfate, combinations and hydrates (e.g., zinc nitrate hexahydrate) thereof. The alkaline chemical can be a strong or weak base, including but not limited to, KOH, NaOH, ammonia, an amine and an amide. The concentration of the zinc containing salt or the alkaline chemical in the solution can be in the range of from 0.01 M to 0.5 M. These two chemicals can be mixed in any ratio (e.g., 1:1 molar ratio). For example, an aqueous solution of zinc nitrate (0.1M) and hexamethylenetetramine (0.1 M) was mixed in a glass container, and then heated up to a temperature in the range of from 60° C.-95° C. A substrate comprising glass, a back contact layer and an absorber layer was immersed into the solution and held for a period of time ranging from 0.5 hour to 10 hours. The sample was then rinsed with deionized water, and heated at 80-120° C. to evaporate residual water. The thickness of the layer of i-ZnO can be tailored, for example, in the range of 5 nm-100 nm.

During fabrication of a photovoltaic device, a plurality of large-sized substrates are dipped into a solution in a chemical tank. The present disclosure provides an apparatus for such a chemical bath deposition to reduce the required solution mixing time and increase solution uniformity. The apparatus and the related method can be used for making a material layer such as a buffer layer of photovoltaic device above a substrate using chemical bath deposition. The resulting material layer has improved uniformity in thickness and then uniformity in performance such as open-circuit voltage (Voc) and short circuit current (Jsc) across each of the plurality of large-sized substrates.

Figure 1A:
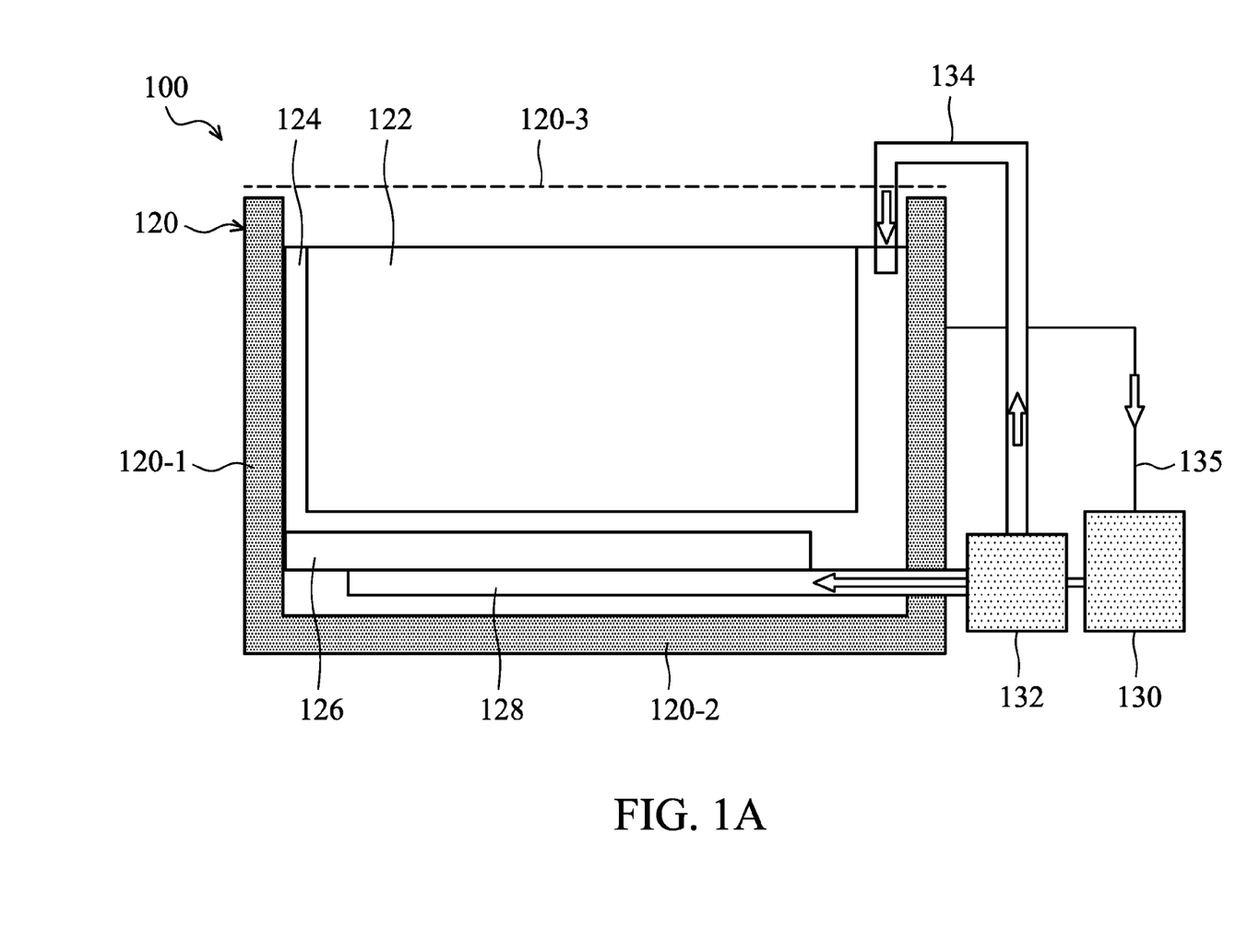
FIG. 1A illustrates a schematic view of an apparatus for chemical bath deposition in accordance with some embodiments.
Figure 1B:
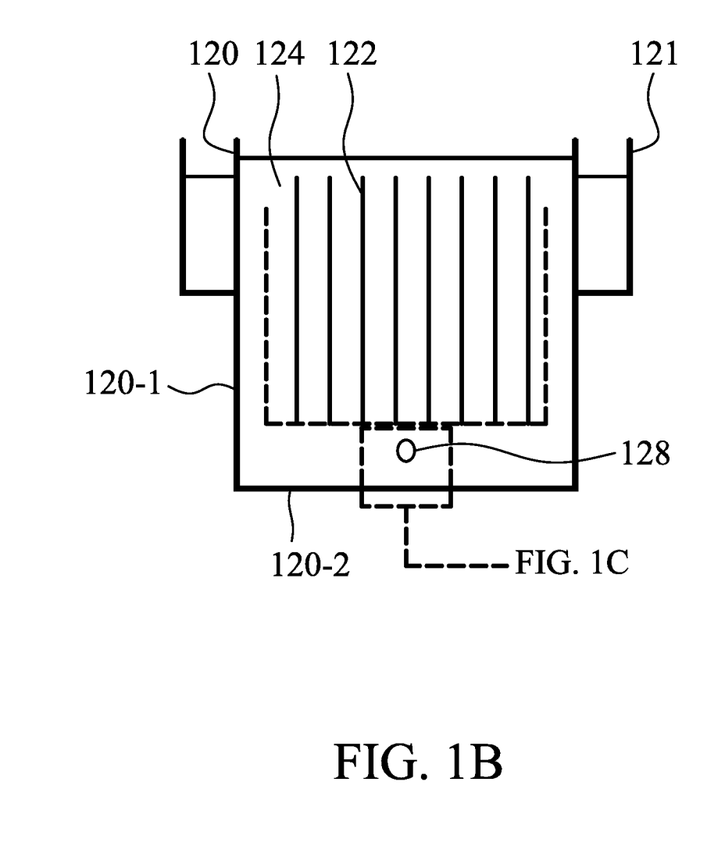
FIG. 1B illustrates a cross-sectional view of a chemical tank in the apparatus of FIG. 1A.
Figure 1C:
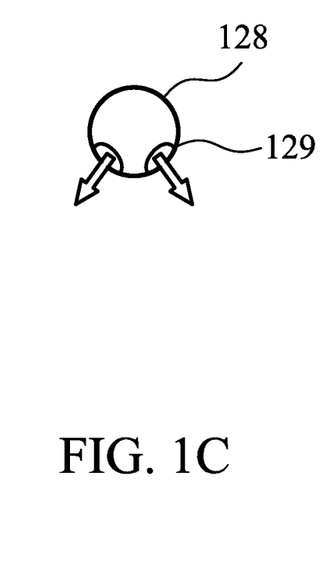
FIG. 1C illustrates a magnified view of a circulation pipe inside the chemical tank of FIG. 1B.

FIGS. 1A-1C illustrate an apparatus 100 for chemical bath deposition in some embodiments. Apparatus 100 can be an apparatus upon which apparatuses 200, 300 and 400 are built. In other words, apparatus 100 shows features shared by apparatuses 200, 300, 400 or other apparatus in accordance with some embodiments. As shown in FIG. 1A, apparatus 100 comprises a housing (120-1, 120-2) defining a chemical tank 120 and a circulation pipe 128. Chemical tank 120 is made of a material having resistance to chemicals, for example, resistance to acid or alkaline. Chemical tank 120 has an opening on a top surface 120-3 and is configured to accept and hold at least one substrate 122 therein. Circulation pipe 128 has at least one portion inside chemical tank 120, and is configured to supply at least one chemical 124 to chemical tank 120. As shown in FIG. 1B, the at least one substrate 122 can comprise a plurality of substrates parallel to each other held inside chemical tank 120 using other fixtures (not shown). Chemical tank 120 can contain additional channel 121 at its outer edge for storing excessive chemicals.

As shown in FIG. 1A, apparatus 100 can also comprise a heater 126 inside chemical tank 120. Circulation pipe 128 can be fluidly connected with a filter unit 130 and a pump 132, which are located outside chemical tank 120 and are connected with one or more chemical storage containers (not shown). Pump 132 can also be fluidly connected to the top portion of chemical tank 120 through a pipe 134 for adjusting pressure and chemical level inside chemical tank 120. The at least one chemical 124 inside chemical tank 120 can be also transported back to filter 130 through a pipe or other suitable connection 125.

As shown in FIG. 1B, a portion of the circulation pipe 128 inside chemical tank 120 is disposed above and adjacent to a bottom wall 120-2 of chemical tank 120. As shown in the magnified view of FIG. 1C, on the portion of circulation pipe 128 inside chemical tank 120 can have a plurality of vent holes 129 configured to provide chemical 124 from circulation pipe 128 to chemical tank 120. In some embodiments, each of the plurality of vent holes 129 on the portion of the circulation pipe 128 is configured to provide chemical 124 substantially downward from the circulation pipe 128. Unless expressly indicated otherwise, references to a "substantially downward" made below will be understood to encompass any direction below the horizontal centerline of the circulation pipe. Such a direction can have at least one downward directional portion deviated from the horizontal direction. Circulation pipe 128 is the pathway of chemicals. In some embodiments, chemicals in additional channel 121 can flow through circulation tube 135 (FIG. 1A) to the filter unit 130, and then to circulation pipe 128 through pump 132.

FIGS. 2A-2B, 3A-3B and 4A-4B illustrate three exemplary apparatuses 200, 300, 400. In each of apparatuses 200, 300, 400 has the feature described in apparatus 100. In addition, each of apparatuses 200, 300, 400 has at least one flow adjustment device 150, which comprises a suitable device such as a turbine 210, a diffuser 310, a bubbler 410 or a combination thereof.

Figure 2A:
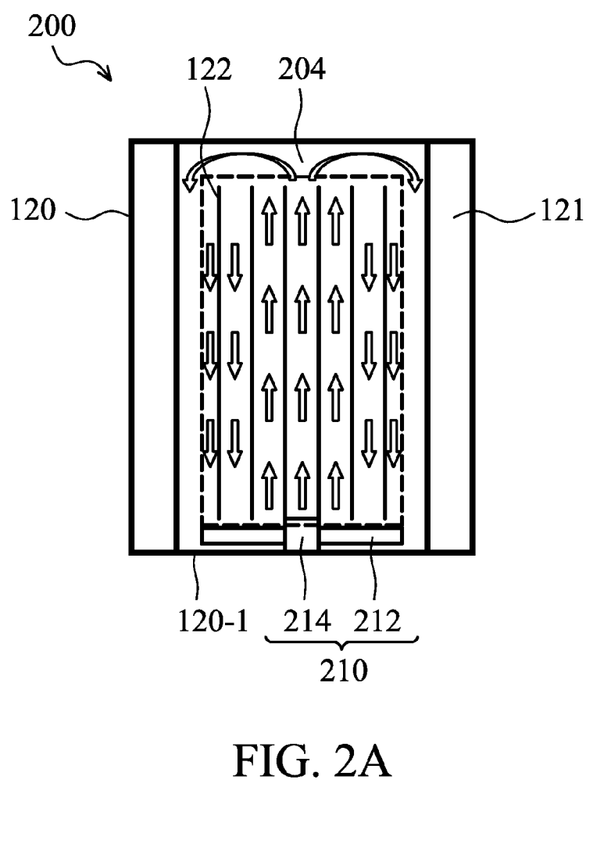
FIG. 2A illustrates a plan view of a portion of an apparatus for chemical bath deposition comprising a turbine in accordance with some embodiments.
Figure 2B:
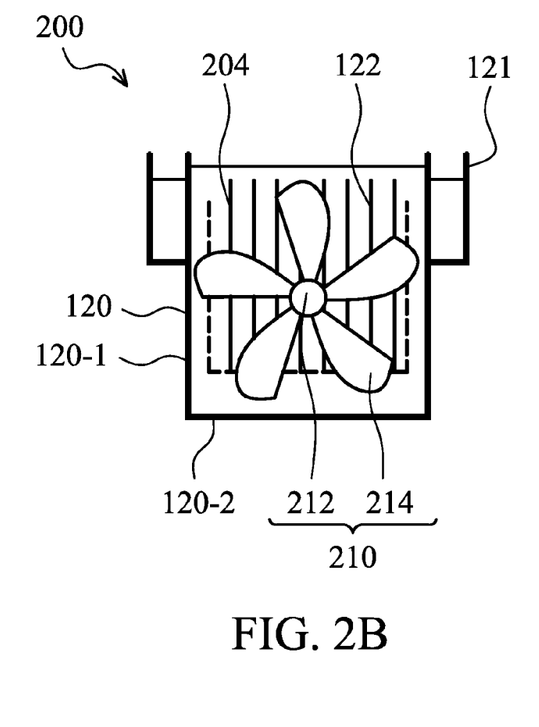
FIG. 2B illustrates a cross-sectional view of a portion of the apparatus of FIG. 2A.

FIG. 2A illustrates a plan view of a portion of apparatus 200 for chemical bath deposition comprising a turbine 210 in accordance with some embodiments. FIG. 2B illustrates a cross-sectional view of a portion of apparatus 200 of FIG. 2A.

In some embodiments, turbine 210 is a reversible turbine disposed adjacent to one side wall 120-1 of chemical tank 120. Turbine 210 can have a center 212, and at least one blade 214 disposed radially from center 212 and substantially parallel to one side wall 120-1 of chemical tank 120.

In some embodiments, turbine 210 is disposed in the center area of one side wall 120-1, as shown in FIG. 2B. Center 212 of turbine 210 is connected with a motor and a controller (not shown). The at least one blade 214 is configured to selectively rotate around center 212 in one of a clockwise or counter-clockwise direction. The controller can be used for controlling the rotation direction of at least one blade 214. The rotating speed of at least one blade can be in any suitable range, for example, in the range from 30 rpm (runs per minute) to 200 rpm.

The length of at least one blade 214 is more than a quarter of depth of chemical tank 120 or a dimension of one side wall 120-1. At least one blade 214, when rotating, covers at least half of the area of one side wall 120-1.

In some embodiments, turbine 210 is configured so that multiple substrates 122 can be placed substantially perpendicular to the rotating plane of at least one blade 214 inside chemical tank 120. However, the at least one blade 214 does not touch any substrate 122. As shown in FIG. 2A, chemical 124 can flow between multiple substrate 122 in the direction illustrated in arrows of FIG. 2A.

In some embodiments, two or more turbines 210 can be used. For example, two turbines 210 can be disposed adjacent to two side walls 120-1 of chemical tank 120. Two turbines 210 can be disposed parallel to each other adjacent to two opposite side walls 120-1. For another example, four turbines 210 can be disposed adjacent to each of four side walls 120-1 of chemical tank. In some embodiments, two turbines 210 arranged opposite each other are configured so that their angular velocity vectors are in the same direction (Thus, if the turbines are mounted facing in opposite directions with respect to an axis, one is rotated clockwise with respect to its motor, and the other is rotated counterclockwise with respect to its motor, so that both turbines rotate in the same direction with respect to inertial space). Thus, the first turbine 210 "pushes" fluid toward the second, while the second turbine 210 "pulls" the fluid from the first. In other embodiments (not shown), one or more turbines 210 are located near the bottom or top of the tank 120.

Figure 3A:
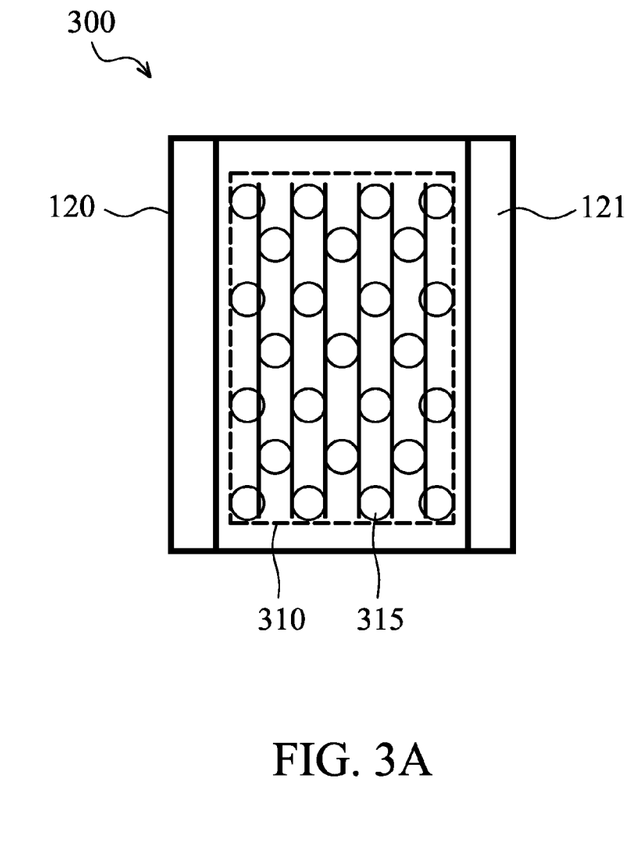
FIG. 3A illustrates a plan view of a portion of an apparatus for chemical bath deposition comprising a diffuser in accordance with some embodiments.
Figure 3B:
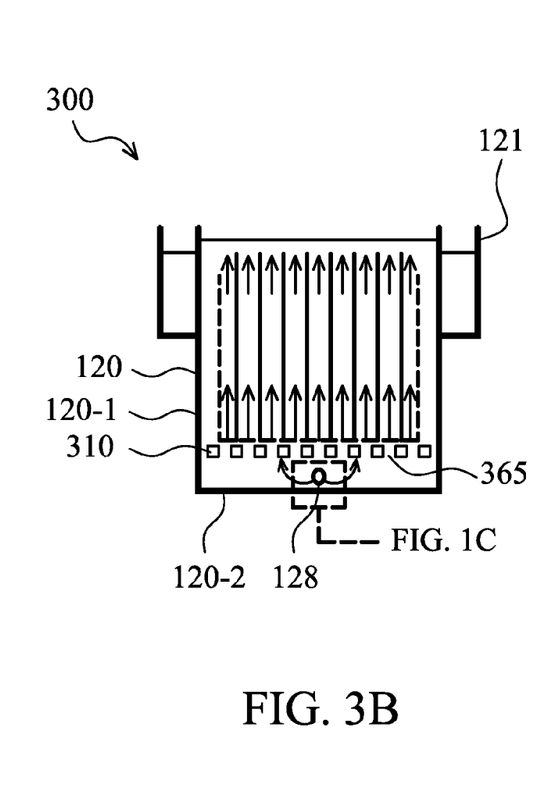
FIG. 3B illustrates a cross-sectional view of a portion of the apparatus of FIG. 3A.

FIG. 3A illustrates a plan view of a portion of an apparatus 300 for chemical bath deposition comprising a diffuser 310 in accordance with some embodiments. FIG. 3B illustrates a cross-sectional view of a portion of apparatus 300 of FIG. 3A.

In some embodiments, as shown in FIG. 1C, each of the plurality of vent holes 129 on the portion of the circulation pipe 128 is configured to provide chemical 124 substantially downward from the circulation pipe 128. Unless expressly indicated otherwise, references to a "substantially downward" made below will be understood to encompass any direction below the horizontal centerline of the circulation pipe. Such a direction can have at least one downward directional portion deviated from the horizontal direction.

In some embodiments, diffuser 310 as one flow adjustment device is disposed above circulation pipe 128. Diffuser 310 comprises a plate having a plurality of holes or pores 365 and is configured to diffuse chemical 124 from circulation pipe 128 upward through plate (310). The holes or pores 365 can be in any suitable size, for example, in the range of from 2 centimeters to 10 centimeters. In some embodiments, diffuser 310 and circulation pipe 128 are disposed adjacent to and above a bottom wall 120-2 of chemical tank 120. In some embodiments, the size of diffuser 310 is substantially the same or slightly smaller than the area of bottom wall 120-2. Apparatus 300 is so configured that at least one substrate 124 can be held through fixture (not shown) above diffuser 310, which may or may not touch substrate 124. Diffuser 310 and circulation pipe 128 are below substrate 124.

In some embodiments, diffuser 310 is one single layer comprising a plurality of holes 365. In some other embodiments, diffuser 310 has a multiple-layered structure comprising a plurality of holes or pores 365. Two or more diffusers 310 having a single layer structure can be also used. In some embodiments, two horizontal, parallel diffuser plates are included, where each diffuser plate has a plurality of holes, and the holes of the top diffuser plate are not aligned above the holes of the first diffuser plate.

Figure 4A:
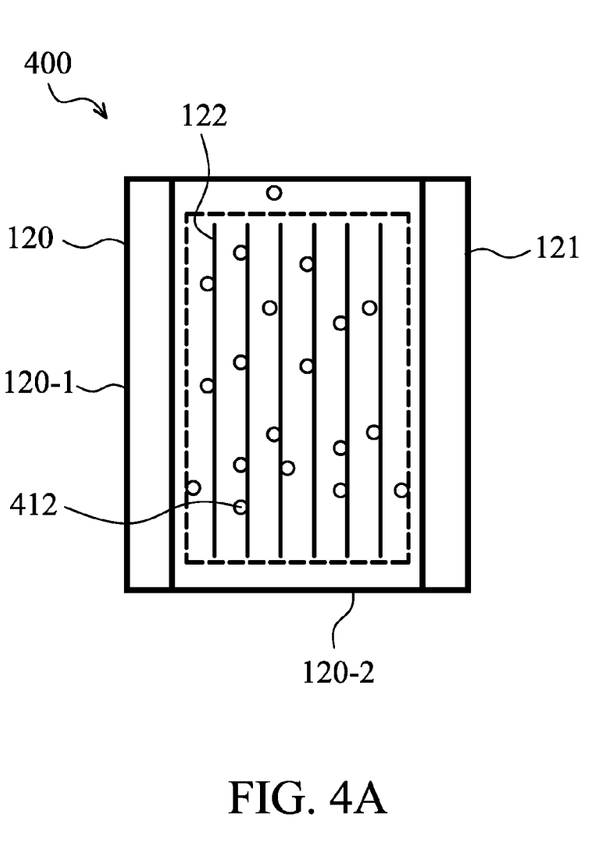
FIG. 4A illustrates a plan view of a portion of an apparatus for chemical bath deposition comprising a gas bubbler in accordance with some embodiments.
Figure 4B:
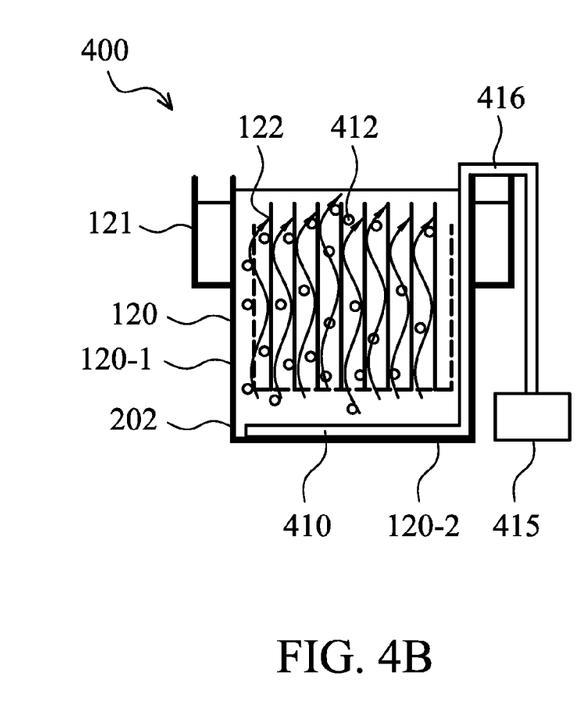
FIG. 4B illustrates a cross-sectional view of a portion of the apparatus of FIG. 4A.
Figure 5:
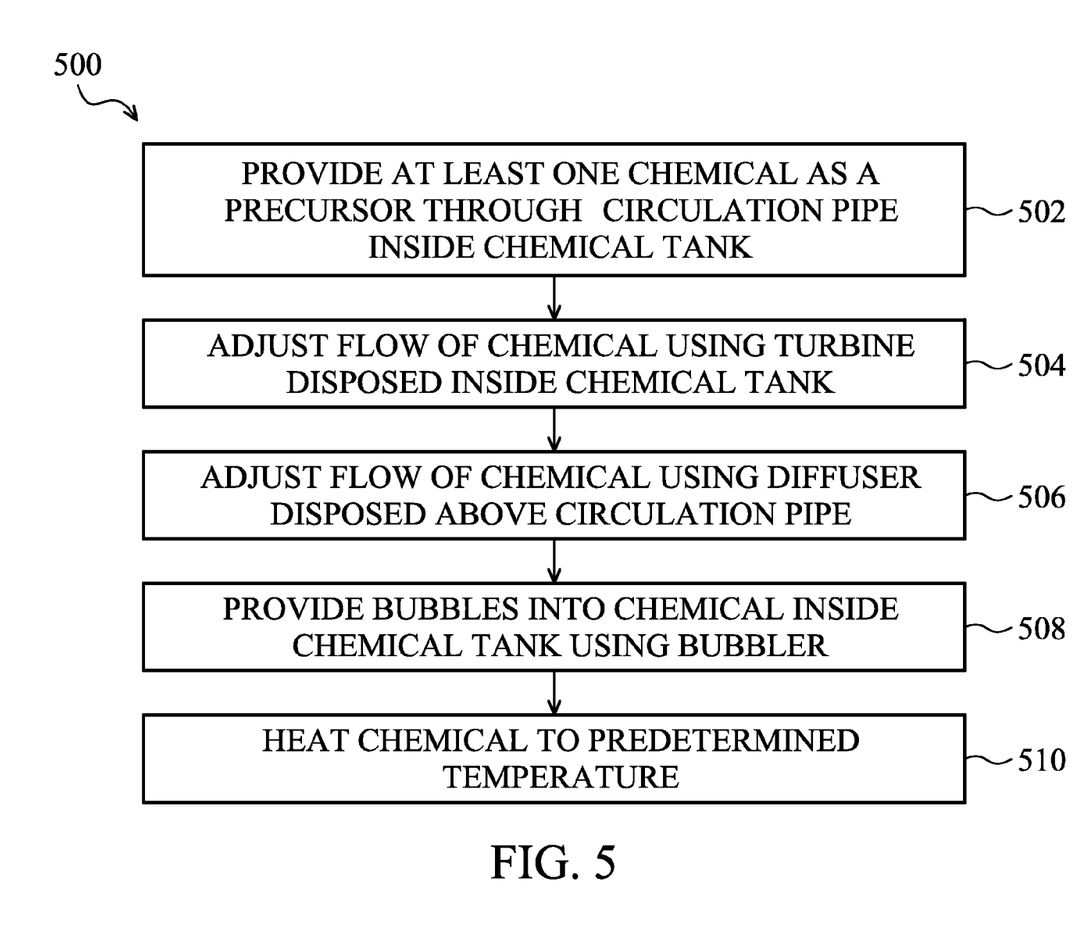
FIG. 5 is a flow chart diagram illustrating an exemplary method for making a material layer of a photovoltaic device using chemical bath deposition in accordance with some embodiments.

FIG. 4A illustrates a plan view of a portion of an apparatus 400 for chemical bath deposition comprising a gas bubbler 410 in accordance with some embodiments. FIG. 4B illustrates a cross-sectional view of a portion of apparatus 400 of FIG. 4A.

In some embodiments, bubbler 410 as one flow adjustment device is disposed adjacent to and above a bottom wall 120-2 of chemical tank 120, and is configured to provide gas bubbles 412 inside chemical tank 120. Bubbler 410 can be connected with a gas source 415 through a pipe or tube 416. Gas source 415 can be connected with a controller (not shown) for controlling gas pressure or volume. Gas source 415 is configured to supply inert gas such as nitrogen or argon, which does not affect reaction of chemical bath deposition in chemical tank 120. Bubbler 410 can be in any shape, such as in the form of a pipe or a plate (e.g., a rectangular or circular plate) configured to provide gas bubble through one surface of bubbler 410. Bubbler 410 can have a plurality of holes or pores (not shown) thereon to release the gas. The holes or pores on bubbler 410 can be in any suitable range, for example, in the range of from 0.5 cm to 5 cm. Bubbler 410, for example in a shape of a plate, can have a size substantially the same or slightly smaller than the area of bottom wall 120-2. The holes or pores on the bubbler 410 can be one a top surface or a bottom surface of a plate-shaped bubbler 410. The released gas bubbles 412 can move upward to chemical 124 in substantially the whole chemical tank 120. In some embodiments, bubbler 410 helps to improve chemical distribution with suitable flow pattern between substrates 124.

In some embodiments, apparatus 200, 300 or 400 further comprises a heater 126 disposed inside chemical tank 120 and configured to adjust a temperature of chemical 124 inside chemical tank 120. The temperature can be at any suitable range, for example, in the range of from 40° C. to 100° C.

In some embodiments, the at least one flow adjustment device 150 comprises a combination of two or more selected from the group consisting of a turbine 210, a diffuser 310 and a bubbler 410. Any combination of one or more turbine 210, diffuser 310 and bubbler 410 can be used.

For one example, in some embodiments, an apparatus 500 (not shown) comprises housing (120-1 and 120-2) defining a chemical tank 120, a circulation pipe 128, and at least one flow adjustment device 150 disposed inside chemical tank 120. As illustrated in FIG. 1A, chemical tank 120 has an opening on a top surface 120-3 and configured to accept and hold at least one substrate 122 therein. Circulation pipe 128 has at least one portion inside chemical tank 120, and is configured to supply at least one chemical 124 to chemical tank 120. The at least one flowing adjustment device 150 comprises a turbine 210 disposed adjacent to one side wall 120-1 of chemical tank 120 (shown in FIGS. 2A-2B), and a diffuser 310 disposed above circulation pipe 128 (as shown in FIGS. 3A-3B). The portion of circulation pipe 128 inside chemical tank 120 has a plurality of vent holes 129 (FIG. 1C) configured to provide the chemical from circulation pipe 128 to chemical tank 120. Each of the plurality of vent holes 129 on the portion of circulation pipe 128 is configured to direct chemical 124 substantially downward from circulation pipe 128. Diffuser 310 comprises a plate having a plurality of holes or pores 365 and is configured to diffuse chemical 124 from circulation pipe 128 upward through the plate (310).

In some embodiments, the at least one flowing adjustment device 150 in apparatus 500 further comprises a bubbler 410 disposed adjacent to and above a bottom wall 120-2 of chemical tank 120 (as shown in FIGS. 4A-4B), and configured to provide gas bubbles 412 inside chemical tank 120.

Turbine 210, diffuser 310, and bubbler 410 can be used separately or in combinations. In some embodiments, diffuser 310 and bubbler 410 are used together. Diffuser 310 is disposed above bubbler 410. The gas bubble from bubbler 410 can pass through the holes of diffuser 310.

The present disclosure also provides a method for making a material layer of photovoltaic device above a substrate 122 using chemical bath deposition. Examples of a material layer of photovoltaic device to be formed above substrate 122 using chemical bath deposition include but are not limited to a buffer layer. The thickness of the material layer such as a buffer layer is on the order of nanometers, for example, in the range of from 5 nm to 100 nm in some embodiments.

FIG. 5 illustrates an exemplary method 500 for making a material layer of a photovoltaic device using chemical bath deposition in accordance with some embodiments. Method 500 can comprise one or more steps selected from steps 502, 504, 506, 508, 510 and a combination thereof. These steps are not necessarily in a specific order. The selected steps can be also performed simultaneously.

At step 502, at least one chemical 124 as a precursor for the material layer is provided through circulation pipe 128 inside chemical tank 120, as described in FIGS. 1A-1C. The at least one chemical 124 depends on the type of material layer to be formed above substrate 122. In some embodiments, two or more chemicals 124 are used. Examples of suitable chemical 124 are described above. For example, chemicals 124 for forming CdS as a buffer layer can comprise ammonia, $CdSO_4$ and thiourea.

At step 504, in some embodiments, flow of chemical 124 is adjusted using a turbine 210 disposed inside chemical tank 120, as described in FIGS. 2A-2B.

At step 506, in some embodiments, flow of chemical 124 is adjusted using diffuser 310 disposed above circulation pipe 128. Diffuser 310 comprises a plate having a plurality of holes and is configured to diffuse chemical 124 from circulation pipe 128 upward through the plate, as described in FIGS. 3A-3B

At step 508, in some embodiments, bubbles 412 are provided into chemical 124 inside chemical tank 120 using bubbler 410 disposed adjacent to and above a bottom wall 120-2 of chemical tank 120, as described in FIGS. 4A-4B.

At step 510, the chemical is heated to a predetermined temperature as described in FIGS. 1A-1C. The temperature can be at any suitable range, for example, in the range of from 40° C. to 100° C. In some embodiments, method 500 comprises heating the solution to a temperature in the range of from 40° C. to 100° C.; and immersing substrate 122 into chemical 124 for a period of time ranging from 0.5 hour to 10 hours.

During the fabrication process, the time for mixing a uniform chemical solution is significantly shortened. The chemical solution can also reach narrow spaces between substrates 122. The resulting material layer such as a buffer layer formed using the method in the present disclosure has uniform thickness distribution. With uniform thickness of a buffer layer increases, the resulting photovoltaic device has increased Voc and decreased Jsc. Uniform thickness of the buffer layer can also prevent shunting current. The averaged electric efficiency of the photovoltaic device has significantly been increased.

The present disclosure provides an apparatus for chemical bath deposition, and a method for making a material layer such as a buffer layer of photovoltaic device above a substrate using chemical bath deposition.

The apparatus comprises a housing defining a chemical tank, a circulation pipe, and at least one flow adjustment device disposed inside the chemical tank. The chemical tank has an opening on a top surface and is configured to accept and hold at least one substrate therein. The circulation pipe has at least one portion inside the chemical tank, and is configured to supply at least one chemical to the chemical tank. The at least one flow adjustment device comprises a device selected from a group consisting of a turbine, a diffuser and a bubbler. In some embodiments, the at least one flow adjustment device comprises a combination of two or more selected from the group consisting of a turbine, a diffuser and a bubbler.

In some embodiments, the portion of the circulation pipe inside the chemical tank is disposed above and adjacent to a bottom wall of the chemical tank. The portion of the circulation pipe inside the chemical tank can have a plurality of vent holes configured to provide the chemical from the circulation pipe to the chemical tank. In some embodiments, each of the plurality of vent holes on the portion of the circulation pipe is configured to provide the chemical substantially downward from the circulation pipe.

In some embodiments, the at least one flow adjustment device comprises a reversible turbine disposed adjacent to one side wall of the chemical tank. The turbine can have a center, and at least one blade disposed radially from the center and substantially parallel to the one side wall of the chemical tank. The at least one blade is configured to selectively rotate around the center in one of a clockwise or counter-clockwise direction.

In some embodiments, the at least one flow adjustment device comprises a diffuser disposed above the circulation pipe. The diffuser comprises a plate having a plurality of holes and is configured to diffuse the chemical from the circulation pipe upward through the plate. In some embodiments, the diffuser and the circulation pipe are disposed adjacent to and above a bottom wall of the chemical tank, and below the at least one substrate to be held inside the chemical tank.

In some embodiments, the at least one flow adjustment device comprises a bubbler disposed adjacent to and above a bottom wall of the chemical tank, and is configured to provide gas bubbles inside the chemical tank.

In some embodiments, the apparatus further comprises a heater disposed inside the chemical tank and configured to adjust a temperature of the chemical inside the chemical tank.

In some embodiments, the present disclosure provides an apparatus for chemical bath deposition, comprising a housing defining a chemical tank, a circulation pipe, and at least one flow adjustment device disposed inside the chemical tank. The chemical tank has an opening on a top surface and configured to accept and hold at least one substrate therein. The circulation pipe has at least one portion inside the chemical tank, and is configured to supply at least one chemical to the chemical tank. The at least one flowing adjustment device comprises a turbine disposed adjacent to one side wall of the chemical tank, and a diffuser disposed above the circulation pipe. The portion of the circulation pipe inside the chemical tank has a plurality of vent holes configured to provide the chemical from the circulation pipe to the chemical tank. Each of the plurality of vent holes on the portion of the circulation pipe is configured to direct the chemical substantially downward from the circulation pipe. The diffuser comprises a plate having a plurality of holes and is configured to diffuse the chemical from the circulation pipe upward through the plate. In some embodiments, the at least one flowing adjustment device further comprises a bubbler disposed adjacent to and above a bottom wall of the chemical tank, and configured to provide gas bubbles inside the chemical tank.

In another aspect, the present disclosure also provides a method for making a material layer (e.g., a buffer layer) of photovoltaic device above a substrate using chemical bath deposition. The method comprises providing at least one chemical as a precursor for the material layer through a circulation pipe inside a chemical tank, and adjusting flow of the chemical using a turbine disposed inside the chemical tank. In some embodiments, the method further comprises adjusting flow of the chemical using a diffuser disposed above the circulation pipe. The diffuser comprises a plate having a plurality of holes and is configured to diffuse the chemical from the circulation pipe upward through the plate. In some embodiments, the method further comprises providing bubbles into the chemical inside the chemical tank using a bubbler disposed adjacent to and above a bottom wall of the chemical tank. In some embodiments, the method can further comprise heating the chemical to a predetermined temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for chemical bath deposition, comprising:
   a housing defining a chemical tank, the chemical tank having an opening on a top surface and configured to accept and hold at least one substrate therein;
   a circulation pipe, having at least one horizontal portion inside the chemical tank, and configured to supply at least one chemical to the chemical tank; and
   at least one flow adjustment device disposed inside the chemical tank, the at least one flowing adjustment device comprising a turbine or a diffuser,
   wherein the at least one horizontal portion of the circulation pipe inside the chemical tank has a plurality of vent holes configured to provide the chemical from the circulation pipe to the chemical tank;

wherein the turbine is a reversible turbine disposed adjacent to one side wall of the chemical tank, the one side wall being a vertical wall.

2. The apparatus of claim 1, wherein the at least one horizontal portion of the circulation pipe inside the chemical tank is disposed above and adjacent to a bottom wall of the chemical tank.

3. The apparatus of claim 1, wherein each of the plurality of vent holes on the portion of the circulation pipe is configured to provide the chemical substantially downward from the circulation pipe.

4. The apparatus of claim 1, wherein the turbine has a center, and at least one blade disposed radially from the center and substantially parallel to the one side wall of the chemical tank, and the at least one blade is configured to selectively rotate around the center in one of a clockwise or counter-clockwise direction.

5. The apparatus of claim 1, wherein the at least one flow adjustment device comprises a diffuser disposed above the circulation pipe, the diffuser comprising a plate having a plurality of holes and configured to diffuse the chemical from the circulation pipe upward through the plate.

6. The apparatus of claim 5, wherein the diffuser and the circulation pipe are disposed adjacent to and above a bottom wall of the chemical tank, and below the at least one substrate inside the chemical tank.

7. The apparatus of claim 1, wherein the at least one flow adjustment device further comprises a bubbler disposed adjacent to and above a bottom wall of the chemical tank, and configured to provide gas bubbles inside the chemical tank.

8. The apparatus of claim 1, wherein the at least one flow adjustment device comprises a combination of two or more selected from the group consisting of a turbine, a diffuser and a bubbler.

9. The apparatus of claim 1, further comprising:
a heater disposed inside the chemical tank and configured to adjust a temperature of the chemical inside the chemical tank.

10. An apparatus for chemical bath deposition, comprising:
a housing defining a chemical tank, the chemical tank having an opening on a top surface and configured to accept and hold at least one substrate therein;
a circulation pipe, having at least one horizontal portion inside the chemical tank, and configured to supply at least one chemical to the chemical tank; and
at least one flow adjustment device disposed inside the chemical tank, the at least one flowing adjustment device comprising
a turbine disposed adjacent to one side wall of the chemical tank, and
a diffuser disposed above the circulation pipe,
wherein the at least one horizontal portion of the circulation pipe inside the chemical tank has a plurality of vent holes configured to provide the chemical from the circulation pipe to the chemical tank;
wherein the turbine is a reversible turbine disposed adjacent to one side wall of the chemical tank, the one side wall being a vertical wall.

11. The apparatus of claim 10, wherein the diffuser comprises a plate having a plurality of holes and configured to diffuse the chemical from the circulation pipe upward through the plate.

12. The apparatus of claim 10, wherein the at least one flowing adjustment device comprises a bubbler disposed adjacent to and above a bottom wall of the chemical tank, and configured to provide gas bubbles inside the chemical tank.

13. An apparatus for chemical bath deposition, comprising:
a housing defining a chemical tank, the chemical tank having an opening on a top surface and configured to accept and hold at least one substrate therein;
a circulation pipe, having at least one horizontal portion inside the chemical tank, and configured to supply at least one chemical to the chemical tank; and
at least one flow adjustment device disposed inside the chemical tank, wherein the at least one flow adjustment device comprises a combination of two or more selected from the group consisting of a turbine, a diffuser and a bubbler,
wherein the at least one horizontal portion of the circulation pipe inside the chemical tank has a plurality of vent holes configured to provide the chemical from the circulation pipe to the chemical tank;
wherein the turbine is a reversible turbine disposed adjacent to one side wall of the chemical tank, the one side wall being a vertical wall.

14. The apparatus of claim 13, wherein the turbine has a center, and at least one blade disposed radially from the center and substantially parallel to the one side wall of the chemical tank, and the at least one blade is configured to selectively rotate around the center in one of a clockwise or counter-clockwise direction.

15. The apparatus of claim 13, wherein the diffuser is disposed above the circulation pipe, the diffuser comprising a plate having a plurality of holes and configured to diffuse the chemical from the circulation pipe upward through the plate.

16. The apparatus of claim 13, wherein the bubbler is disposed adjacent to and above a bottom wall of the chemical tank, and configured to provide gas bubbles inside the chemical tank.

* * * * *